United States Patent
Fan et al.

(10) Patent No.: US 6,444,523 B1
(45) Date of Patent: Sep. 3, 2002

(54) METHOD FOR FABRICATING A MEMORY DEVICE WITH A FLOATING GATE

(75) Inventors: Tso-Hung Fan, Hsien; Tao-Cheng Lu, Koashiung; Wen-Jer Tsai, Hualian; Samuel Pan, Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/860,422

(22) Filed: May 18, 2001

(30) Foreign Application Priority Data

Apr. 4, 2001  (TW) .......................... 90108179 A

(51) Int. Cl.⁷ ................... H01L 21/336; H01L 21/8238
(52) U.S. Cl. .................. 438/257; 438/199; 438/225
(58) Field of Search ................ 438/257, 199, 438/225, 527, 424; 365/185.19, 185.21, 185.28

(56) References Cited

U.S. PATENT DOCUMENTS

| | | | | |
|---|---|---|---|---|
| 5,260,593 A | * | 11/1993 | Lee | 257/316 |
| 5,428,239 A | * | 6/1995 | Okumura et al. | 257/371 |
| 5,600,593 A | * | 2/1997 | Fong | 365/185.19 |
| 5,963,799 A | * | 10/1999 | Wu | 438/199 |
| 6,009,017 A | * | 12/1999 | Guo et al. | 365/185.28 |
| 6,031,760 A | * | 2/2000 | Sakui et al. | 365/185.21 |
| 6,146,970 A | * | 11/2000 | Witek et al. | 438/424 |
| 6,272,050 B1 | * | 8/2001 | Cunningham et al. | 365/185.28 |
| 6,331,952 B1 | * | 12/2001 | Wang et al. | 365/185.29 |
| 6,331,953 B1 | * | 12/2001 | Wang et al. | 365/185.29 |

* cited by examiner

*Primary Examiner*—Richard Booth
*Assistant Examiner*—Walter L. Lindsay, Jr.
(74) *Attorney, Agent, or Firm*—J.C. Patents

(57) ABSTRACT

A fabrication method for a memory device with a floating gate is provided. A substrate is provided. A channel doping step is performed on the substrate, wherein the actual threshold voltage of the subsequently formed memory device becomes greater than the preset threshold voltage. A stack gate and source/drain regions are then sequentially formed on the substrate to complete the formation of the memory device. The drain-turn-on leakage is prevented by an increase of the actual threshold voltage.

19 Claims, 3 Drawing Sheets

METHOD FOR FABRICATING A MEMORY DEVICE WITH A FLOATING GATE

CROSS-REFERENCE TO RELATED APPLICATION

This application claims the priority benefit of Taiwan application serial no. 90108179, filed on Apr. 4, 2001.

BACKGROUND OF THE INVENTION

1. Field of Invention

This invention relates to a fabrication method for a memory device. More particularly, the present invention relates to a fabrication method for a memory device that comprises a floating gate.

2. Description of Related Art

A memory device that comprises a floating gate, for example, a flash memory device or other type of electrically erasable programmable read-only memory device, is programmable, erasable and has the ability of retaining data when the power is interrupted. Furthermore, such a device is highly integrated and thus is commonly used in personal computers and electronic devices.

One of the methods to perform the program operation for the above memory device with a floating gate is channel hot electron injection, wherein a positive voltage, for example, 12 Volts, is applied to the control gate to open up the channel. An appropriate voltage, for example, 6 Volts, is concurrently applied to the drain region to form an electric field that extends from the source region to the drain region. As the bias between the source region and the drain region is great enough, hot electrons are generated in the channel region. Some of the hot electrons are injected through the tunnel oxide layer into the floating gate to perform the program operation.

As a device becomes integrated, the memory cells of the memory device are more closely packed together. For example, when channel hot electron injection is used to perform the program operation on the memory cell A of a one transistor cell (1T cell) technique type of memory device, a high voltage is applied to the control gate and concurrently a voltage is applied to the drain region of the memory cell A. However, the drain region of the memory cell B in the memory device, which is not undergoing a program operation, is connected to the drain region of the memory cell A through the same bit line. Being affected by the drain coupling effect, the floating gate of the memory cell B also experiences a current flow, leading to a current leakage at the memory cell B. This phenomenon is known as the drain-turn-on leakage. As the channel length of the memory device further being reduced, the drain-turn-on leakage effect would become more serious. The presence of the drain-turn-on leakage adversely affects the reliability of a device.

SUMMARY OF THE INVENTION

The present invention provides a fabrication method for a memory device with a floating gate, wherein the drain-turn-on leakage is prevented to increase the reliability of the memory device.

The invention provides a fabrication method for a memory device with a floating gate, wherein the method is applicable to the scale down memory device to increase the integration of the memory device.

The present invention provides a fabrication method for a memory device with a floating gate, wherein a substrate is provided. A channel doping step is performed on the substrate so that the actual threshold voltage of the memory device is greater than the preset threshold voltage of the memory device. Thereafter, a stack gate and source/drain regions are sequentially formed on the substrate to complete the fabrication of the memory device. The dopant concentration in the substrate is increased by the channel doping step, the actual threshold voltage thus increases correspondingly to prevent the drain-turn-on leakage.

According to a preferred embodiment of the present invention, the dopant concentration in the substrate is increase when the channel doping step is performed. The actual threshold voltage of the subsequently formed memory device is thus increased to prevent the drain-turn-on leakage.

Moreover, according to the fabrication method for a memory device with a floating gate of the present invention, the drain-turn-on leakage is also prevented when the device is scaled down or integration is increased. The method of the present invention is thus applicable for the fabrication of a scale down memory device to increase the integration of the memory device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
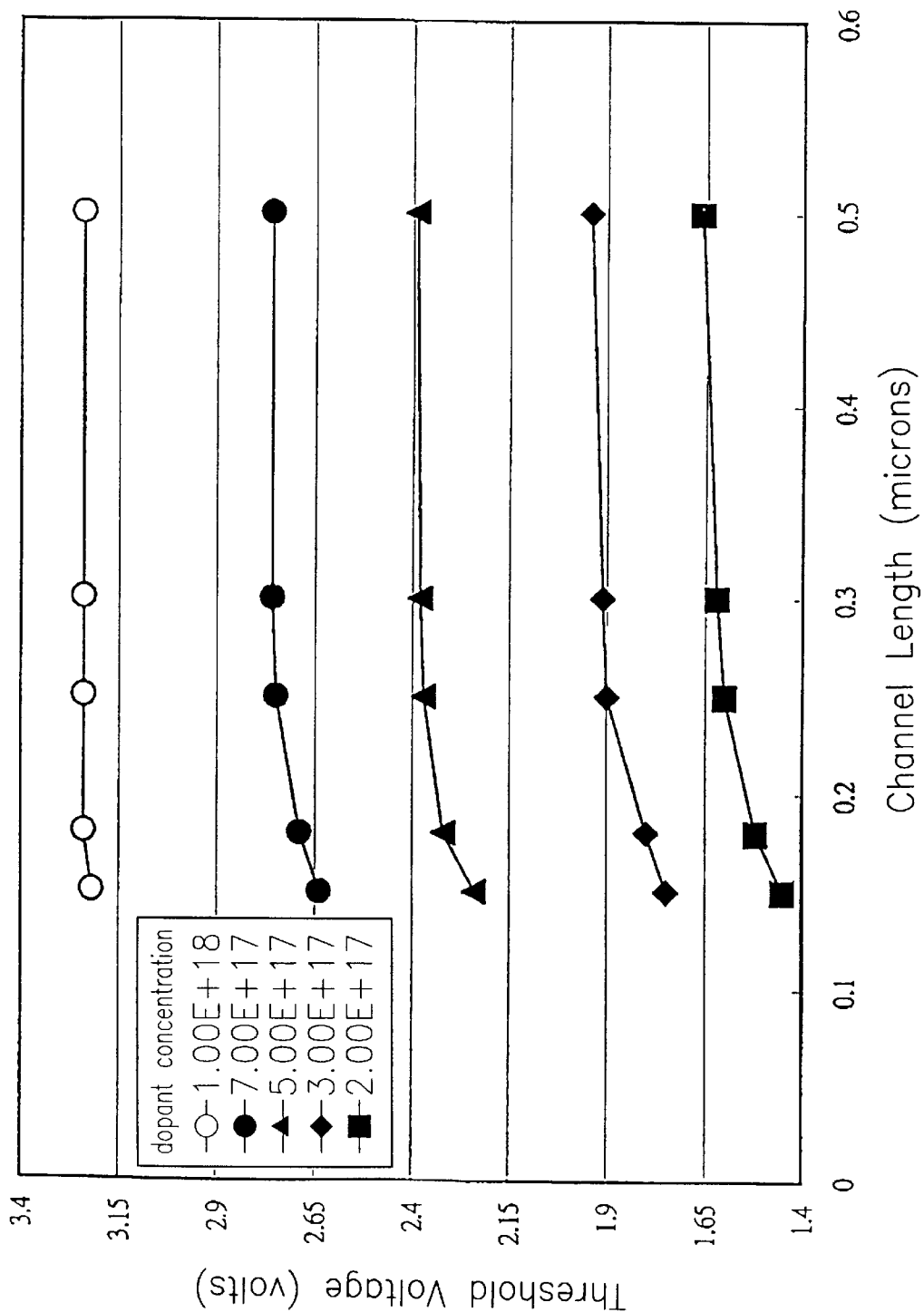
FIG. 1 is a diagram illustrating the threshold voltage in a memory device with a floating gate as a function of the channel length at various dopant concentrations.

Referring to FIG. 1, FIG. 1 illustrates the threshold voltage in a memory device with a floating gate as a function of the channel length at various dopant concentrations, wherein the dopant concentrations are related as follow: ○>●>▲>◆>■. As shown in FIG. 1, as the channel length reduces, the final fresh threshold voltage tends to decrease slightly. However, as the dopant concentration increases, the fresh threshold voltage increases correspondingly. Comparatively, the effect of the channel length on the fresh threshold voltage is not as significant as the effect of the dopant concentration on the fresh threshold voltage. Therefore, increasing the dopant concentration to a memory device of the various channel lengths, as a whole, would increase the fresh threshold voltage.

Figure 2:
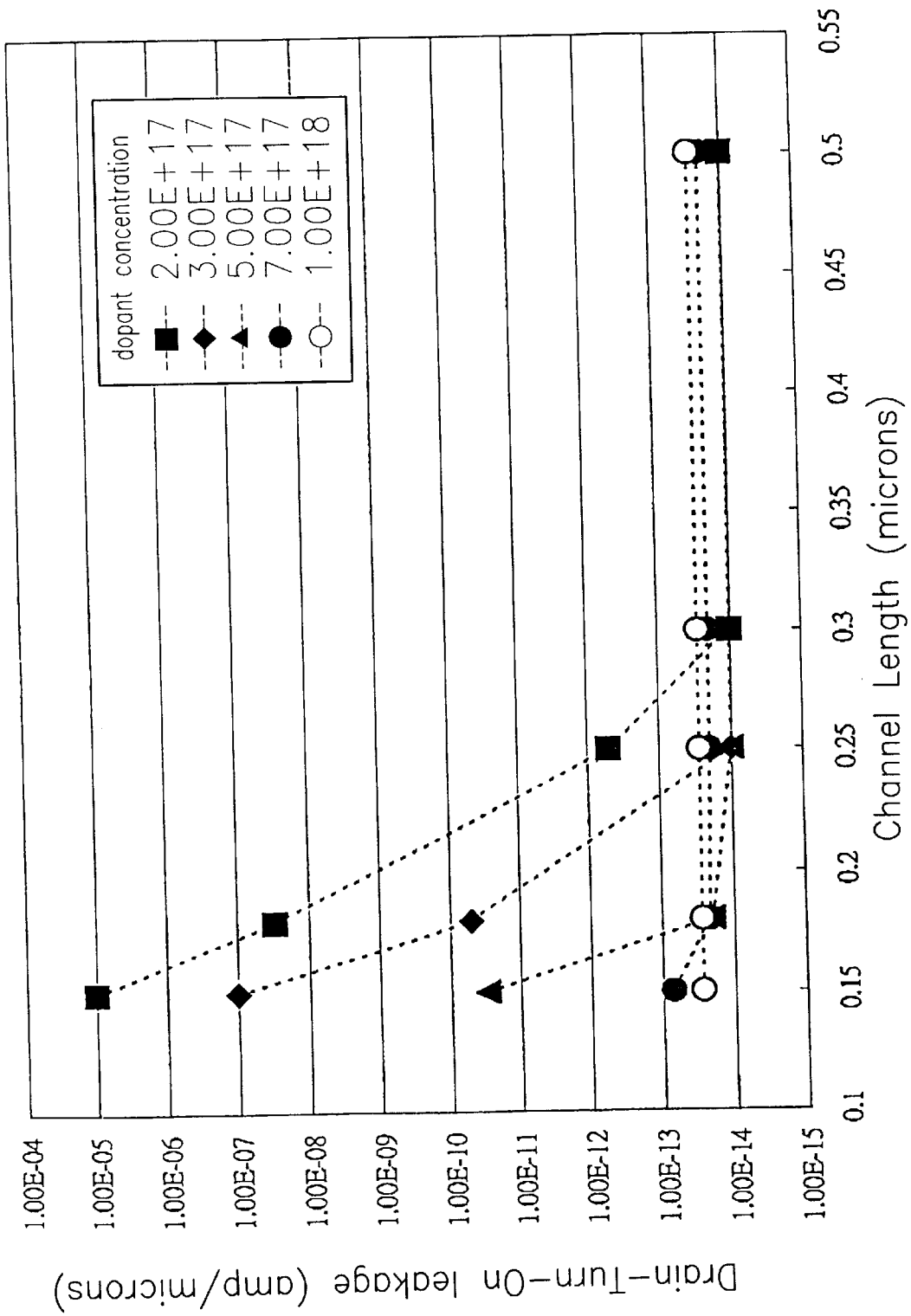
FIG. 2 is a diagram illustrating the drain-turn-on leakage in a memory device with a floating gate as a function of the channel lengths at various dopant concentrations.

Referring to FIG. 2, FIG. 2 illustrates the drain-turn-on leakage in a memory device with a floating gate as a function of the channel length at various dopant concentrations. Similarly, the various dopant concentrations are related as follow: ○>●>▲>◆>■. As shown in FIG. 2, as the channel length becomes shorter, the degree of the drain-turn-on leakage increases correspondingly. Besides being affected by the channel length, the degree of the drain-turn-on leakage is also affected by the dopant concentration. When the dopant concentration is low, the degree of the drain-turn-on leakage increases significantly as the channel length reduces. However, when the dopant concentration increases, in which the channel length is decreased, the increase of the drain-turn-on leakage is suppressed.

Figure 3A:
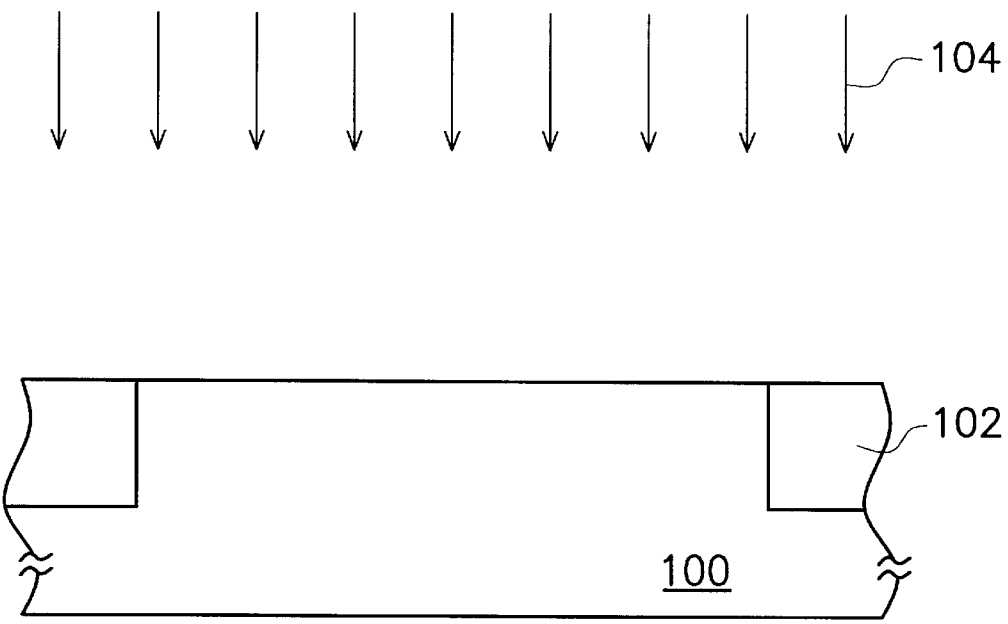
FIGS. 3A to 3B are schematic, cross-sectional view, illustrating the successive steps in fabricating a memory device with a floating gate according to a preferred embodiment of the present invention.

The above results are therefore applied in the fabrication of a memory device with a floating gate. As shown in FIG. 3A, a substrate, comprising shallow trench isolation structures 102 for isolating other parts of the device, is provided. A channel doping step 104 is then performed on the substrate, wherein an actual fresh threshold voltage of the subsequently formed memory device becomes greater than the preset fresh threshold voltage of the memory device. The channel doping step 104, for example, includes a first well region implantation step, a second well region implantation step and a threshold voltage adjustment step. The first well region implantation step is, for example, performing an ion implantation process to implant a P-type dopant at a dosage of about $1\times10^{13}$ to $2.5\times10^{13}/cm^2$, with an implantation energy of about 150000 to 350000 electrical volts. The second well implantation step is, for example, performing an ion implantation process to implant a P-type dopant at a dosage of about $3\times10^{13}$ to $6.5\times10^{13}/cm^2$, with an implantation energy of about 100000 to 150000 electrical volts. The threshold voltage adjustment step is, for example, performing an ion implantation process to implant boron ions at a dosage of about $5\times10^2$ to $25\times10^{12}/cm^2$, with an implantation energy of about 20000 to 70000 electrical volts.

The threshold voltage adjustment step is also, for example, performing an ion implantation process to implant $BF_2$ ions at a dosage of about $5\times10^{12}$ to $25\times10^{12}/cm^2$, with an implantation energy of about 100000 to 400000 electrical vols. The dopant concentration in the substrate resulted from the channel doping step is about $1.5\times10^{18}$ to $5.5\times10^{18}/cm^3$.

Since a larger quantity of dopant is implanted in the substrate in the channel doping step, the dopant concentration in the substrate is thus increased to have the actual threshold voltage of the subsequently formed memory device greater than the preset threshold voltage. The drain-turn-on leakage is thereby prevented by the increase of the actual fresh threshold voltage.

Figure 3B:
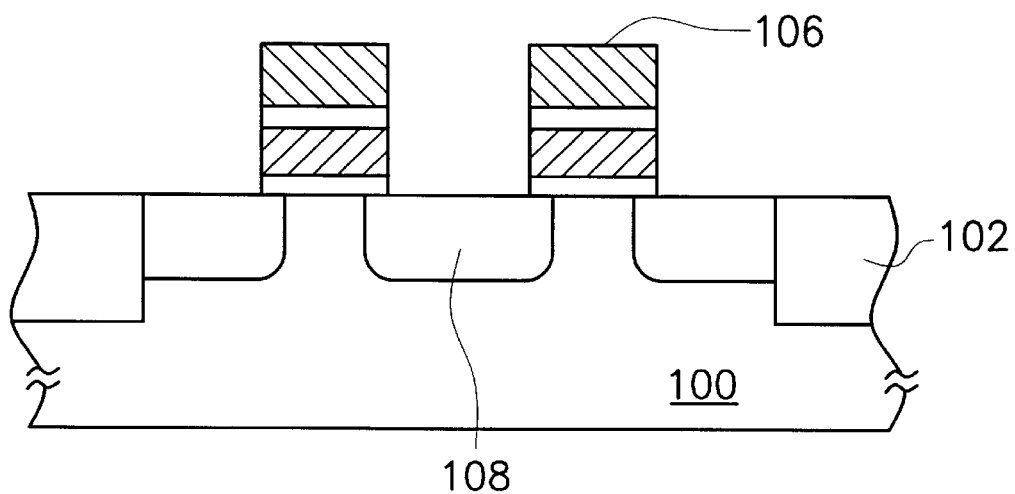

Continuing to FIG. 3B, stack gates 106 are formed on the substrate, wherein the stack gates 106 are formed by a tunnel oxide layer, a floating gate, an oxide dielectric layer and a control gate. Source/drain regions 108 are formed in the substrate 100 on both sides of the stack gate 106. The processing steps in the conventional fabrication for a memory device with a floating gate, for example, the fabrication for an electrically erasable programmable read-only memory device and a flash memory device, is then performed. The aforementioned channel doping step 104 is further performed to adjust the fresh threshold voltage. The final actual fresh threshold voltage after the adjustment step is about 3.5 to 5.5 volts, and it is about 1.5 to 3 volts greater than the conventional pre-adjustment fresh threshold voltage.

According to the present invention, the dosage of the implanted ions is increased when the threshold voltage adjustment step is performed on the substrate. The increase in the dopant concentration in the substrate increases the fresh threshold voltage of the subsequently formed memory device with a floating gate. Even though the channel length of the memory device is reduced, the drain-turn-on voltage is prevented due to the increase in the fresh threshold voltage.

According to the present invention of the fabrication method for a memory device with a floating gate, the drain-turn-on voltage is prevented due to an increase in the fresh threshold voltage. The method is thus applicable to the scale down memory device to increase the integration of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a memory device with a floating gate, comprising:

providing a substrate;

performing a channel doping step that comprises at least three implantation steps on the substrate, wherein each implantation step is performed to implant a dosage of dopants with an implantation energy which are different from dosages and implantation energies of the two other implantation steps such that an actual threshold voltage of the memory device with the floating gate becomes greater than a preset threshold voltage of the memory device with the floating gate;

forming a stack gate on the substrate; and forming a source/drain region in the substrate.

2. The method of claim 1, wherein the channel doping step includes a first well region implantation step, a second well region implantation step and a threshold voltage adjustment implantation step.

3. The method of claim 1, wherein a first implantation step includes performing an implantation process to implant a P-type dopant at a dosage of about $1\times10^{13}$ to $2.5\times10^{13}/cm^2$, with an implantation energy of about 150000 to 350000 electrical volts.

4. The method of claim 1, wherein a second implantation step includes performing an ion implantation process to implant a P-type dopant at a dosage of about $3\times10^{13}$ to $6.5\times10^{13}/cm^2$, with an implantation energy of about 100000 to 150000 electrical volts.

5. The method of claim 1, wherein the memory device with a floating gate includes a flash memory.

6. The method of claim 1, wherein the a third implantation step includes performing an ion implantation process to implant boron ions at a dosage of about $5\times10_{12}$ to $25\times10^{12}/cm^2$, with an implantation energy of about 20000 to 70000 electrical volts.

7. The method of claim 1, wherein the a third implantation step includes performing an ion implantation process to implant $BF_2$ ions at a dosage of about $5\times10^{12}$ to $25\times10^{12}/cm^2$, with an implantation energy of about 100000 to 400000 electrical volts.

8. The method of claim 1, wherein the actual threshold voltage is about 3.5 volts to about 5.5 volts.

9. The method of claim 1, wherein the memory device with a floating gate includes an electrically erasable programmable read-only memory.

10. A method for reducing a drain-turn-on leakage for a memory device with a floating gate, comprising:

providing a substrate; and performing a channel doping step that comprises a plurality of implantation steps on the substrate, wherein each implantation step is performed to implant a dosage of dopants with an implantation energy that are different from dosages and implantation energies of other implantation steps such that an actual threshold voltage of the memory device with the floating gate becomes greater than a preset threshold voltage of the memory device with the floating gate.

11. The method of claim 10, wherein the channel doping step includes a first well region implantation step, a second well region implantation step and a threshold adjustment implantation step.

12. The method of claim 10, wherein a first implantation step includes performing an implantation process to implant a P-type dopant at a dosage of about $1 \times 10^{13}$ to $2.5 \times 10^{13}/$ cm$^2$, with an implantation energy of about 150000 to 350000 electrical volts.

13. The method of claim 10, wherein a second implantation step includes performing an ion implantation process to implant a P-type dopant at a dosage of about $3 \times 10^{13}$ to $6.5 \times 10^{13}/$cm$^2$, with an implantation energy of about 100000 to 150000 electrical volts.

14. The method of claim 11, wherein the memory device with the floating gate includes an electrically erasable programmable read-only memory.

15. The method of claim 10, wherein a third implantation step includes performing an ion implantation process to implant boron ions at a dosage of about $5 \times 10^{12}$ to $25 \times 10^{12}/$ cm$^2$, with an implantation energy of about 20000 to 70000 electrical volts.

16. The method of claim 10, wherein a third implantation step includes performing an ion implantation process to implant BF$_2$ ions at a dosage of about $5 \times 10^{12}$ to $25 \times 10^{12}/$ cm$^2$, with an implantation energy of about 100000 to 400000 electrical volts.

17. The method of claim 10, wherein the actual threshold voltage is about 3.5 volts to about 5.5 volts.

18. The method of claim 10, wherein the memory device with the floating gate includes an electrically erasable programmable read-only memory.

19. A method for fabricating a memory device with a floating gate, comprising:

providing a substrate;

performing a first implantation step, and second implantation step and a third implantation step on the substrate with the first implantation step implanting a first dosage of dopants into a first depth of the substrate, the second implantation step implanting a second dosage of dopants into a second depth of the substrate and the third implantation step implanting a third dosage of dopants into a third depth of the substrate such that an actual threshold voltage of the memory device with the floating gate becomes greater than a preset threshold voltage of the memory device with the floating gate.

* * * * *